(12) United States Patent
Takeuchi et al.

(10) Patent No.: US 7,931,065 B2
(45) Date of Patent: Apr. 26, 2011

(54) PRINTED CIRCUIT BOARD MANUFACTURING EQUIPMENT

(75) Inventors: Satoshi Takeuchi, Nagoya (JP); Atusi Sakaida, Nagoya (JP); Toshihisa Taniguchi, Handa (JP); Toshikazu Harada, Kariya (JP); Maki Chiba, Nagoya (JP)

(73) Assignee: DENSO CORPORATION, Kariya (JP)

( * ) Notice: Subject to any disclaimer, the term of this patent is extended or adjusted under 35 U.S.C. 154(b) by 198 days.

(21) Appl. No.: 12/385,895

(22) Filed: Apr. 23, 2009

(65) Prior Publication Data

US 2009/0266492 A1 Oct. 29, 2009

(30) Foreign Application Priority Data

Apr. 23, 2008 (JP) .................................. 2008-112988

(51) Int. Cl.
  *B32B 37/00* (2006.01)
(52) U.S. Cl. .................... 156/583.3; 156/581; 156/583.1
(58) Field of Classification Search .................. 156/228, 156/580, 581, 583.1, 583.3
  See application file for complete search history.

(56) References Cited

U.S. PATENT DOCUMENTS

| 7,290,580 B2* | 11/2007 | Naitoh et al. ................. 156/581 |
| 2002/0076903 A1 | 6/2002 | Kondo et al. |
| 2002/0192442 A1 | 12/2002 | Kondo et al. |
| 2003/0209796 A1 | 11/2003 | Kondo et al. |
| 2004/0091687 A1 | 5/2004 | Kondo et al. |
| 2006/0113356 A1* | 6/2006 | Matsumura et al. .......... 228/101 |

FOREIGN PATENT DOCUMENTS

| JP | A-05-177653 | 7/1993 |
| JP | A-2002-011791 | 1/2002 |
| JP | A-2006-049502 | 2/2006 |
| JP | A-2007-169332 | 7/2007 |
| JP | A-2007-203313 | 8/2007 |

* cited by examiner

*Primary Examiner* — James Sells
(74) *Attorney, Agent, or Firm* — Posz Law Group, PLC

(57) ABSTRACT

In a printed circuit board manufacturing equipment, a pressing die includes a first pressing part, a second pressing part, and a frame part. A buffer member is disposed between a first surface of a laminated body and the first pressing part. The second pressing part has a portion facing a second surface of the laminated body and a portion facing the buffer member. The frame part surrounds a whole area of a side surface of the buffer member. Before pressing and heating, the laminated body, the second pressing part, and the buffer member define an escape space therebetween for escaping the buffer member deformed due to the pressing. A lip protrudes from the frame part toward the laminated body. The lip is deformed following the deformation of the buffer member and comes in contact with a surface of the second pressing part facing the buffer member.

10 Claims, 5 Drawing Sheets

PRINTED CIRCUIT BOARD MANUFACTURING EQUIPMENT

CROSS REFERENCE TO RELATED APPLICATIONS

The present application is based on and claims priority to Japanese Patent Application No. 2008-112988 filed on Apr. 23, 2008, the contents of which are incorporated in their entirety herein by reference.

BACKGROUND OF THE INVENTION

1. Field of the Invention

The present invention relates to an equipment for manufacturing a printed circuit board including a base member and a multilayer wiring pattern arranged in the base member.

2. Description of the Related Art

In a conventional manufacturing method of a printed circuit board, a plurality of resin films made of a thermoplastic resin is stacked and is pressed and heated so as to formed a base member including a multilayer wiring pattern as described, for example, in US 2003/0209796 A (corresponding to JP-A-2003-86948).

In the above-described method, a conductive pattern is formed on a single side of each of the resin films. The resin films are stacked in a stacking direction to configurate a laminated body. The resin films are treated with a hot pressing. That is, the resin films are pressed and heated from above and below in the stacking direction. Thereby, the resin films adhere to each other and a printed circuit board is formed.

If the laminated body is pressed and heated directly by hot-pressing plates, a pressure applied to each portion of the laminated body may vary due to inclination and undulation of the hot-pressing plates, and unevenness of the laminated body. The unevenness of the laminated body is caused by a variation in density of the conductive patterns and connectors for connecting the conductive patterns arranged on different layers. The variation in the pressure may cause pattern flowing, poor interlayer connection, and insufficient interlayer adhesion.

In a first example of the related art illustrated in FIG. 9, a buffer member 280 is disposed between a hot-pressing plate 221 and a laminated body 290. The laminated body 290 is pressed and heated by the hot-pressing plate 221 and a hot-pressing plate 220. The buffer member 280 has a low elastic modulus so as to be deformable and has a high heat resistance so as to withstand heat during the hot pressing. For example, the buffer member 280 has a compressive elastic modulus less than or equal to about 10 MPa. In such a case, variation in a pressure applied from the hot-pressing plates 220 and 221 to each portion of the laminated body 290 can be reduced.

However, the buffer member 280 having a low elastic modulus may act like fluid. Thus, during the hot pressing, the buffer member 280 may be plastically deformed in a horizontal direction approximately perpendicular to the stacking direction as illustrated in FIG. 9. If the buffer member 280 is plastically deformed, a crack may generate in the buffer member 280. In such a case, a shape of the buffer member 280 does not recover after the hot pressing. Thus, the number of reusing the buffer member 280 may be reduced.

In a second example of the related art illustrated in FIG. 10, an upper pressing part 250 is further provided. The upper pressing part 250 has a base section 251 and a sidewall section 252. The base section 251 has a plate shape and transmits the heat and the pressure from the hot-pressing plate 221 to the laminated body 290 through the buffer member 280. The sidewall section 252 protrudes from the base section 251 so as to surround the whole area of a side surface of the buffer member 280. In such a case, the sidewall section 252 of the upper pressing part 250 can restrict flow of the buffer member 280 in the horizontal direction. If an end surface of the sidewall section 252 comes in contact with the hot-pressing plate 220, more pressure cannot be applied to the laminated body 90. Thus, the end surface of the sidewall section 252 is apart from the hot-pressing plate 220. Therefore, as illustrated in FIG. 10, the buffer member 280 may flow from a clearance between the upper pressing part 250 and the hot-pressing plate 220. In such a case, a deforming amount of the buffer member 280 may increase and the buffer member 280 may be plastically deformed. Thus, the number of reusing the buffer member 280 may be reduced.

SUMMARY OF THE INVENTION

In view of the foregoing problems, it is an object of the present invention to provide a printed circuit board manufacturing equipment that can reduce a variation in a pressure applied to each portion of a laminated body.

A printed circuit board manufacturing equipment according to an aspect of the present invention can be used for manufacturing a printed circuit board from a laminated body. The printed circuit board includes a base member and a multilayer wiring pattern disposed in the base member. The laminated body includes a plurality of base films made of a thermoplastic resin and stacked in a stacking direction. The laminated body has a first surface and a second surface opposing each other in the stacking direction and a side surface connecting the first surface and the second surface. The printed circuit board manufacturing equipment includes a pressing die, a buffer member, and a lip. The pressing die is configured to press and heat the laminated body from above and below in the stacking direction so that the plurality of base films adheres to each other and configurates the base member. The buffer member is disposed between the first surface of the laminated body and the pressing die. The buffer member is larger than the first surface of the laminated body so as to cover a whole area of the first surface of the laminated body. The buffer member is elastically deformable and is configured to withstand the heating by the pressing die. The buffer member is configured to reduce a variation in a pressure applied from the pressing die to each portion of the laminated body. The pressing die includes a first pressing part, a second pressing part, and a frame part. The first pressing part faces the first surface of the laminated body through the buffer member. The first pressing part is larger than the first surface of the laminated body so as to cover the whole area of the first surface of the laminated body. The second pressing part is larger than the second surface of the laminated body so as to cover a whole area of the second surface of the laminated body. The second pressing part has a portion facing the second surface of the laminated body and a portion facing the buffer member. The second pressing part is apart from the first pressing part at least before the pressing and heating. The frame part has a ring shape and surrounds a whole area of a side surface of the buffer member in a direction approximately perpendicular to the stacking direction. The frame part is integrated with the first pressing part and is separated from the second pressing part at least during the pressing and heating. The side surface of the laminated body, the second pressing part, and the buffer member define an escape space therebetween at least before the pressing and heating so that for the buffer member deformed due to the pressing escapes into the escape space. The lip has a thin plate shape. The lip protrudes from the frame part toward the laminated body and is located on a surface of the buffer member facing the laminated body. The lip is deformable following the deformation of the buffer member and comes in contact with a surface of the second pressing part facing the laminated body.

In the present printed circuit board manufacturing equipment, the pressure applied from the pressing die to each portion of the laminated body can be reduced by elastic deformation of the buffer member. Thus, a quality stability of the printed circuit board can be improved.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

First Embodiment

Figure 1:
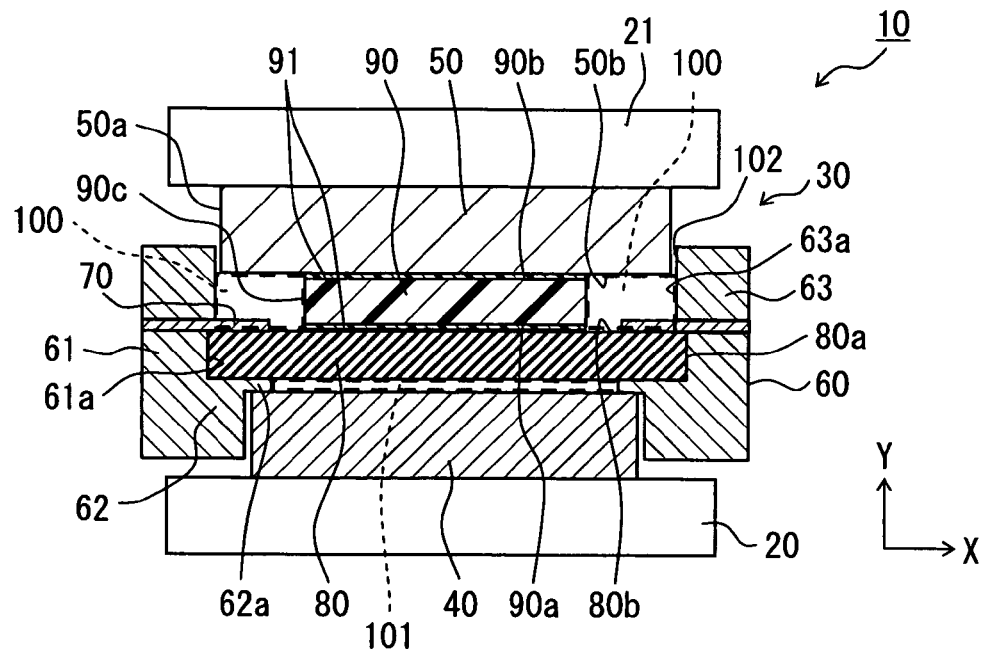
FIG. 1 is a diagram illustrating a cross-sectional view of a printed circuit board manufacturing equipment according to a first embodiment of the present invention.

A printed circuit board manufacturing equipment 10 according to a first embodiment of the present invention will be described with reference to FIG. 1 to FIG. 4.

The printed circuit board manufacturing equipment 10 includes a pair of hot-pressing plates 20 and 21, a pressing die 30, and a buffer member 80. The pressing die 30 presses and heats a laminated body 90 by receiving a heat and a pressure from the hot-pressing plates 20 and 21. The buffer member 80 is disposed between the pressing die 30 and the laminated body 90. The pressing die 30 includes a frame part 60. A lip 70 is fixed to the frame part 60.

The laminated body 90 is formed of a plurality of base films made of a thermoplastic resin. The base films are stacked in a stacking direction shown by the arrow Y in FIG. 1. The laminated body 90 is disposed between the hot-pressing plates 20 and 21. The hot-pressing plates 20 and 21 press and heat the laminated body 90 from above and below in the stacking direction. Each of the hot-pressing plates 20 and 21 may be made of a conductive metal material such as, for example, titan and may be configured to generate heat when electric current flows therein. Alternatively, a heater may be disposed in each of the hot-pressing plates 20 and 21 or a channel through which high-temperature fluid flows may be provided in each of the hot-pressing plates 20 and 21. In FIG. 1, the hot-pressing plate 20 is located on a lower side in the stacking direction and the hot-pressing plate 21 is located on an upper side in the stacking direction. The pressing die 30 is independent from the hot-pressing plates 20 and 21. The pressure and the heat from the hot-pressing plates 20 and 21 are applied to the laminated body 90 through the pressing die 30.

The pressing die 30 includes a lower pressing part 40 and an upper pressing part 50 for transmitting the pressure and the heat from the hot-pressing plates 20 and 21 to the laminated body 90. The lower pressing part 40 is disposed between the laminated body 90 and the hot-pressing plates 20. The lower pressing part 40 has a pressing surface facing a lower surface 90a of the laminated body 90. The upper pressing part 50 is disposed between the laminated body 90 and the hot-pressing plates 21. The upper pressing part 50 has a pressing surface facing an upper surface 90b of the laminated body 90.

The lower pressing part 40 and the upper pressing part 50 are configured to withstand the pressure and the heat from the hot-pressing plates 20 and 21 and transmit the pressure and the heat to the laminated body 90 effectively. The upper pressing part 50 is apart from the buffer member 80 at least in a positioning state before a hot pressing so that escape space 100 is provided between the upper pressing part 50 and the buffer member 80. Each of the lower pressing part 40 and the upper pressing part 50 has a plate shape and is made of metal such as, for example, stainless steel and iron. Thus, the lower pressing part 40 and upper pressing part 50 can effectively transmit the heat from the hot-pressing plates 20 and 21 to the laminated body 90. During the hot pressing, the lower pressing part 40 and the upper pressing part 50 do not come in contact with each other. Each of the pressing surfaces is planarized into a mirror surface. The pressing surface of the lower pressing part 40 is larger than the lower surface 90a of the laminated body 90 so as to cover the whole area of the lower surface 90a. The pressing surface of the upper pressing part 50 is larger than the upper surface 90b of the laminated body 90 so as to cover the whole area of the upper surface 90b.

The buffer member 80 is disposed between the lower pressing part 40 and the lower surface 90a of the laminated body 90. Thus, the pressure and the heat from the hot-pressing plates 20 is transmitted to the laminated body 90 through the lower pressing part 40 and the buffer member 80.

As described above, the pressing die 30 includes the frame part 60. The frame part 60 can restrict deformation of the buffer member 80 in a horizontal direction shown by the arrow X in FIG. 1. At least during the hot pressing, the frame part 60 is integrated with the lower pressing part 40 and is separated from the upper pressing part 50. The frame part 60 includes a base section 61. The base section 61 has a ring shape and surrounds the whole area of a side surface 80a of the buffer member 80 so as to restrict the deformation of the buffer member 80 in the horizontal direction. Before the hot pressing, a distance between an inner surface 61a of the base section 61 and a side surface 90c of the laminated body 90 is longer than a distance between a side surface 50a of the upper pressing part 50 and the side surface 90c of the laminated body 90. The side surface 80a of the buffer member 80 is in contact with the inner surface 61a of the base section 61. By restricting deformation of the buffer member 80 in the horizontal direction, plastic deformation of the buffer member 80 can be restricted.

As illustrated in FIG. 1, the frame part 60 has an approximately L-shape in a vertical cross section. The frame part 60 further includes a holding section 62. The holding section 62 has a ring shape and is bent from a lower end of the base section toward the laminated body 90. The holding section 62 holds a peripheral end portion of a lower surface of the buffer member 80 facing the lower pressing part 40. The holding section 62 has a flange 62a protruding inwardly from an inner surface of the holding section 62. In the stacking direction, a thickness of the flange 62a is less than a thickness of a portion of the holding section 62 other than the flange 62a. Before the hot pressing, the flange 62a is located between the buffer member 80 and the lower pressing part 40. The frame part 60 is in contact with the lower pressing part 40 in a ring manner at a lower surface of the flange 62a. Before the hot pressing, the lower pressing part 40, the holding section 62 of the frame part 60 and the buffer member 80 define escape space 101 therebetween. In FIG. 1, the escape space 101 is shown by dashed line. The escape space 101 can be used for escaping the buffer member 80 deformed due to the pressure. The escape space 101 is closed to an outside of the printed circuit board manufacturing equipment 10.

The frame part 60 further includes a fixing section 63 having a ring shape. The fixing section 63 and the base section 61 fix the lip 70 therebetween. In a state before the hot pressing, an inner surface 63a of the fixing section 63 faces the side surface 50a of the upper pressing part 50 so as to have a clearance 102 between the inner surface 63a and the side surface 50a. The side surface 90c of the laminated body 90, the upper pressing part 50 and the buffer member 80 define the escape space 100 therebetween. The escape space 100 has a ring shape surrounding the laminated body 90. In FIG. 1, the escape space 100 is shown by dashed line. The escape space 100 can be used for escaping the buffer member 80 deformed due to the pressure. At least before the hot pressing, the escape space 100 communicates with the outside of the printed circuit board manufacturing equipment 10 through the clearance 102 provided between the side surface 50a of the upper pressing part 50 and the inner surface 63a of the fixing section 63. Thus, the escape space 100 is open to the outside of the printed circuit board manufacturing equipment 10. In this way, the printed circuit board manufacturing equipment 10 has the two escape spaces 100 and 101 for escaping the buffer member 80 deformed due to the pressure.

The lip 70 is fixed to the frame part 60. Before the hot pressing, the lip 70 protrudes from the frame part 60 toward the laminated body 90 and is located on an upper surface 80b of the buffer member 80 facing the lower surface 90a of the laminated body 90. During the hot pressing, the lip 70 is deformed following the deformation of the buffer member 80 due to the pressure. When the lip 70 is deformed, the lip 70 comes in contact with a lower surface 50b of the upper pressing part 50 facing the upper surface 90b of the laminated body 90. Thereby, in the escape space 100 having the ring shape, a part between the laminated body 90 and the lip 70 is closed to the outside of the printed circuit board manufacturing equipment 10.

The lip 70 has a flexibility and a heat resistance so that the lip 70 can follow the deformation of the buffer member 80. The lip 70 is a thin plate made of metal such as, for example, stainless steel. In the present embodiment, the lip 70 is a thin plate having a ring shape, having a thickness of about 0.1 mm, and made of stainless steel. The lip 70 is fixed to frame part 60, for example, by binding, in a state where a part of the lip 70 is held between the base section 61 and the fixing section 63 of the frame part 60. The lip 70 protrudes from the frame part 60 toward the laminated body 90 in a ring manner. A protruding length of the lip 70 may be substantially constant in the whole circumference of the ring and is set so that the lip 70 comes in contact with the lower surface 50b of the upper pressing part 50 during the hot pressing.

The buffer member 80 is provided for reducing variation in the pressure applied from the pressing die 30 to each portion of the laminated body 90. The buffer member 80 is elastically deformable. For example, the buffer member 80 has a compressive elastic modulus less than or equal to about 10 MPa. The buffer member 80 has a high heat resistance so that the buffer member 80 can withstand the heat, for example, about 300 degrees centigrade during the hot pressing. The buffer member 80 is disposed at least between one of the lower surface 90a and the upper surface 90b of the laminated body 90 and corresponding one of the lower pressing part 40 and the upper pressing part 50. The buffer member 80 is larger than the one of the lower surface 90a and the upper surface 90b of the laminated body 90 so as to cover the whole area of the one of the lower surface 90a and the upper surface 90b.

In the present embodiment, the buffer member 80 is larger than the lower pressing part 40 and the upper pressing part 50 in the horizontal direction, as illustrated in FIG. 1. The buffer member 80 is disposed between the lower pressing part 40 and the laminated body 90. The peripheral end portion of the lower surface of the buffer member 80 facing the lower pressing part 40 is held by the holding section 62 of the frame part 60. The buffer member 80 is made of, for example, silicon rubber having a low compressive elastic modulus, a high heat resistance, and a high elongation percentage. For example, the silicon rubber has a compressive elastic modulus less than or equal to about 10 Mpa, a heat resistance greater than or equal to about 300 degrees centigrade, an elongation greater than or equal to about 100 percent. Thus, silicon rubber can be used as a material of the buffer member 80.

Figure 3:
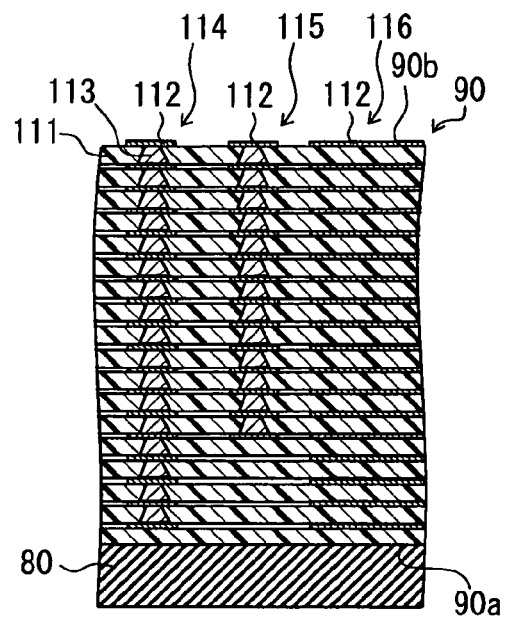
FIG. 3 is a diagram illustrating an enlarged view of a laminated body before the hot pressing.

The laminated body 90 is disposed in the printed circuit board manufacturing equipment 10 having the above-described configuration. The laminated body 90 is a known laminated body formed of a plurality of stacked base films made of the thermoplastic resin. In each of the base films, a wiring pattern and a interlayer connector is provided optionally. The thermoplastic resin includes liquid crystal polymer (LCP), polyether ether ketone (PEEK), polyether imide (PEI), and a mixture of PEEK and PEI, for example. The thermoplastic resin may be any material as long as an integrated laminated body can be formed when a plurality of resin films made of the thermoplastic resin are stacked and are heated under pressure. The laminated body 90 may include, for example, eighteen single-sided wiring patterned films 110 stacked in the stacking direction, as illustrated in FIG. 3. Each of the single-sided wiring patterned films 110 has a base film 111 made of a mixture of PEEK and PEI. On one side of the base film 111, a copper film is disposed. The copper film is pattern-formed so as to configurate a wiring pattern 112. Furthermore, each of the single-sided wiring patterned films 110 optionally has one or more interlayer connector 113. The interlayer connector 113 can be formed by filling a via hole provided on the wiring pattern 112 with a conductive paste and sintering the conductive paste. The interlayer connector 113 electrically couples the wiring patterns 112 of different single-sided wiring patterned films 110. The laminated body 90 includes a first conductive connecting portion 114, a second conductive connecting portion 115, and a stacked portion 116. In the first conductive connecting portion 114, the eighteen-layer wiring patterns 112 are electrically coupled with each other through the interlayer connectors 113. In the second conductive connecting portion 115, fourteen-layer wiring patterns 112 from the upper surface 90b side are electrically coupled with each other through the interlayer connectors 113. In the stacked portion, eighteen-layer wiring patterns 112 are stacked.

In the laminated body 90, there is a portion where many wiring patterns 112 and many interlayer connectors 113 exist and a portion where few wiring pattern 112 and few interlayer connector 113 exist. When the number of layers of the wiring patterns 112 and the number of interlayer connectors 113 are large, a resistance to compression force during the hot pressing increases. If the pressure from the hot-pressing plates 20 and 21 is directly applied to the laminated body 90, the portion where may wiring patterns 112 and many interlayer connectors 113 exist is applied with a pressure greater than the portion where few wiring patterns 112 and few interlayer connector 113 exist due to difference in the resistance to the compression force. However, in the present embodiment, the buffer member 80 is disposed between the lower pressing part 40 and the laminated body 90 for reducing variation in the pressure applied to each portion of the laminated body 90.

An exemplary hot-pressing process with the printed circuit board manufacturing equipment 10 will now be described. The lower pressing part 40 is disposed on a pressing surface of the hot-pressing plate 21. On the lower pressing part 40, the frame part 60 holding the buffer member 80 is disposed in such a manner that the flange 62a comes in contact with the lower pressing part 40 in a ring manner. A die-releasing film 91 is disposed on the buffer member 80. The die-releasing film 91 is made of, for example, polyimide or Teflon (registered trademark). The die-releasing film 91 has a thickness of between about 10 µm and about 100 µm. The laminated body 90 is disposed above the buffer member 80 through the die-releasing film 91. Above the laminated body 90, the upper pressing part 50 is disposed through the die-releasing film 91. A position of the upper pressing part 50 is determined based on a position of the inner surface 63a of the fixing section 63. In this state, the hot-pressing plate 21 is moved downward in the stacking direction. Thereby, the laminated body 90 is presses and heated from above and below by the hot-pressing plates 20 and 21. The heat is transmitted from the hot-pressing plates 20 and 21 to the laminated body 90 so that a temperature of the laminated body 90 is between about 300 degrees centigrade to about 400 degrees centigrade.

Figure 2:
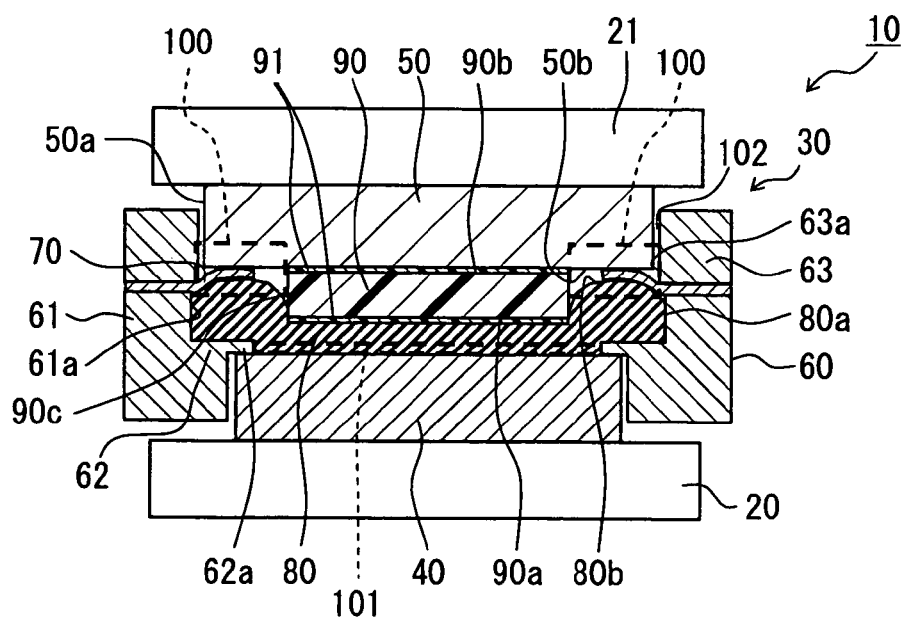
FIG. 2 is a diagram illustrating a cross-sectional view of the printed circuit board manufacturing equipment according to the first embodiment during a hot pressing.

As described above, the pressure and the heat from the hot-pressing plates 20 and 21 are transmitted to the laminated body 90 through the lower pressing part 40 and the upper pressing part 50. That is, the laminated body 90 is hot-pressed by the lower pressing part 40 and the upper pressing part 50. On the upper side of the laminated body 90 in the stacking direction, the upper pressing part 50 is disposed through the die-releasing film 91. On the lower side of the laminated body 90 in the stacking direction, the buffer member 80 is disposed through the die-releasing film 91. Thus, when the laminated body 90 is pressed downward, the buffer member 80 disposed between the laminated body 90 and the lower pressing part 40 is deformed, as illustrated in FIG. 2.

A part of the buffer member 80 located between the laminated body 90 and the lower pressing part 40 flows into the escape space 101 due to the pressing by the laminated body 90. The escape space 101 is almost filled by the buffer member 80 and the lower pressing part 40 comes in contact with the buffer member 80. In this state, a thickness of the buffer member 80 located between the laminated body 90 and the lower pressing part 40 is reduced compared with a state before the hot pressing.

Another part of the buffer member 80 escapes in the horizontal direction from a region between the laminated body 90 and the lower pressing part 40. However, the base section 61 of the frame part 60 restricts horizontal movement of the buffer member 80, and the lower pressing part 40 and the holding section 62 of the frame part 60 restrict downward movement of the buffer member 80. Thus, when the buffer member 80 is deformed, the buffer member 80 swells toward the escape space 100 provided above the buffer member 80. Following the deformation of the buffer member 80, the lip 70 having the thin plate shape is deformed from a fixed portion with the frame part 60. The lip 70 is raised toward the upper pressing part 50 and comes in contact with the peripheral end portion of the lower surface 50b of the upper pressing part 50 which faces the buffer member 80. The lip 70 has the ring shape and comes in contact with the upper pressing part 50 at the whole circumference. Thus, the clearance 102 provided between the side surface 50a of the upper pressing part 50 and the inner surface 63a of the fixing section 63 is closed and the part of the escape space 100 provided between the lip 70 and the laminated body 90 is closed to the outside of the printed circuit board manufacturing equipment 10. That is, a flowing range of the buffer member 80 is limited to the part of the escape space 100 closed to the outside of the printed circuit board manufacturing equipment 10. Thereby, plastic deformation of the buffer member 80 can be restricted.

A swelling amount of the buffer member 80 to the escape space 100 is changed in accordance with the pressure. The lip 70 is deformed following the swell of the buffer member 80. When the swelling amount is large, the lip 70 comes in contact with the upper pressing part 50.

Figure 4:
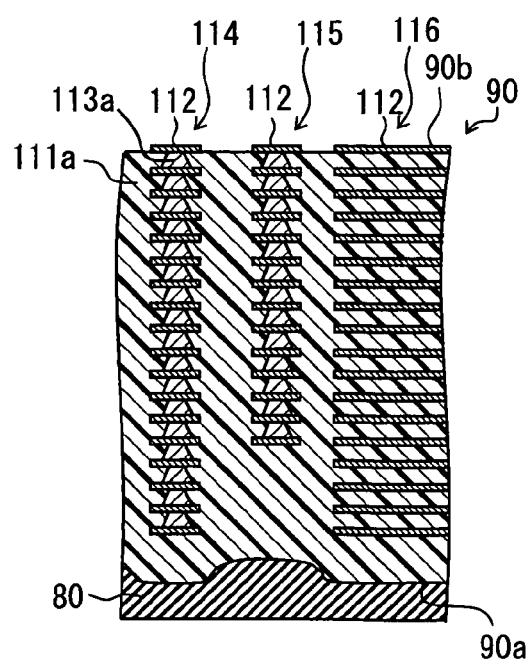
FIG. 4 is a diagram illustrating an enlarged view of the laminated body during the hot pressing.

In the present hot pressing, as illustrated in FIG. 4, the difference in the pressure applied to each portion of the laminated body 90 including the first conductive connecting portion 114, the second conductive connecting portion 115, and the stacked portion 116 is reduced due to the elastic deformation of the buffer member 80. That is, substantially uniform pressure is applied to each portion of the laminated body 90. Thereby, pattern flowing, poor interlayer connection, insufficient interlayer adhesion caused by resin flowing can be reduced.

The base films 111 in the laminated body 90 are softened and adhere to each other so as to configurate one base member 111a made of the thermoplastic resin. In each of the interlayer connectors 113, metal particles in the conductive paste are sintered and are diffusion-bonded with metal in the adjacent wiring pattern 112. Thereby, an interlayer connector 113 electrically coupling the difference wiring patterns 112 is formed. After the hot pressing, the die-releasing films 91 are removed and a printed circuit board is completed.

As described above, in the printed circuit board manufacturing equipment 10 according to the present embodiment, the buffer member 80 is disposed between the lower surface 90a of the laminated body 90 and the lower pressing part 40. The buffer member 80 has a low elastic modulus so as to be deformable and a high heat resistance to as to withstand the heat during the hot pressing. At least before the hot pressing, the escape space 100 is provided between the side surface 90c of the laminated body 90, the upper surface 80b of the buffer member 80, and the lower surface 50b of the upper pressing part 50. The escape space 100 can be used for escaping the buffer member 80 deformed due to the pressure. Thus, the variation in the pressure applied from the hot-pressing plates 20 and 21 to each portion of the laminated body 90 can be reduced due to the elastic deformation of the buffer member 80. Thereby, quality stability of the printed circuit board can be improved.

The frame part 60 in the pressing die 30 surrounds the side surface 80a of the buffer member 80 so as to restrict deformation of the buffer member 80 in the horizontal direction. At least during the hot pressing, the frame part 60 is integrated with the lower pressing part 40 and is separated from the upper pressing part 50. The frame part 60 is configured so that the frame part 60 does not disturb a movement of other parts pressing the laminated body 90 from above and below in the stacking direction. Between the frame part 60 and the upper pressing part 50, the clearance 102 is provided. The clearance 102 communicates the escape space 100 and the outside of the printed circuit board manufacturing equipment 10. The lip 70 is fixed to the frame part 60. The lip 70 is deformed following the deformation of the buffer member 80 due to the pressure and comes in contact with the lower surface 50b of the upper pressing part 50. Thereby, the lip 70 closes the clearance 102. Thus, before the buffer member 80 flows from the escape space 100 to the outside through the clearance 102, the lip 70 closes the part of the escape space 100 located between the lip 70 and the laminated body 90. Thereby, the buffer member 80 is deformed within the part of the escape space 100 located between lip 70 and the laminated body 90 and the deforming amount of the buffer member 80 can be reduced. As a result, the printed circuit board manufacturing equipment 10 can increase the number of reusing the buffer member 80.

In the present embodiment, the lower pressing part 40 is set to be a first pressing part, the upper pressing part 50 is set to be a second pressing part, and the buffer member 80 is disposed between the lower pressing part 40 and the laminated body 90, as an example. Alternatively, the lower pressing part 40 may be the second pressing part, the upper pressing part 50 may be first pressing part, and the buffer member 80 may be disposed between the upper pressing part 50 and the laminated body 90. In such a case, the shape of the frame part 60 illustrated in FIG. 1 is reversed in the stacking direction, the escape space 100 is provided between the laminated body 90, the buffer member 80, and the lower pressing part 40, and the clearance 102 is provided between the lower pressing part 40 and the frame part 60. In addition, the shape of the frame part 60 illustrated in FIG. 1 is reversed in the stacking direction, the escape space 100 is provided between the laminated body 90, the buffer member 80, and the lower pressing part 40, and the clearance 102 is provided between the lower pressing part 40 and the frame part 60.

Second Embodiment

A printed circuit board manufacturing equipment 10 according to a second embodiment of the present invention will be described with reference to FIG. 5.

In the printed circuit board manufacturing equipment 10 according to the present embodiment, a pushing element is added to the printed circuit board manufacturing equipment 10 illustrated in FIG. 1 and FIG. 2. The pushing element is movable in the stacking direction from the lower pressing part 40 side toward the upper pressing part 50 side. After the hot pressing, the pushing element pushes the buffer member 80 from the lower pressing part 40 side.

Figure 5:
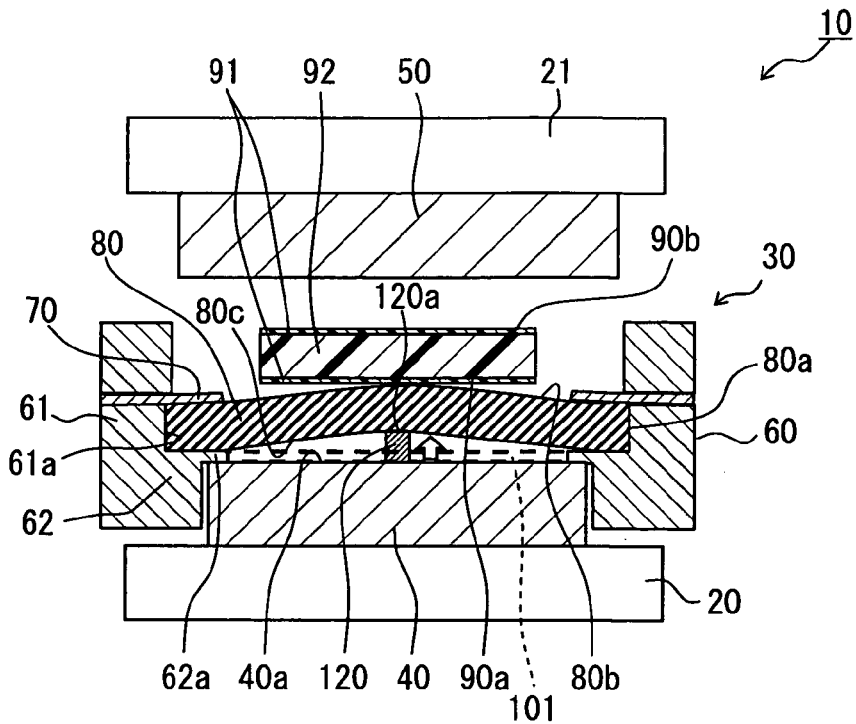
FIG. 5 is a diagram illustrating a cross-sectional view of a printed circuit board manufacturing equipment according to a second embodiment of the present invention at a time when a printed circuit board is removed from the printed circuit board manufacturing equipment.

In an example illustrated in FIG. 5, the pushing element is a pushing pin 120. After the hot pressing, the pushing pin 120 is moved from the lower pressing part 40 side toward the upper pressing part 50 side so as to push the buffer member 80 from the lower pressing part 40 side. The lower pressing part 40 has a hole (not shown) for housing the pushing pin 120.

The pushing pin 120 is housed in the hole. During the hot pressing, an upper surface 120a of the pushing pin 120 is on a plane substantially same as the upper surface 40a of the lower pressing part 40. Thus, the upper surface 120a of the pushing pin 120 becomes a part of the upper surface 40a of the lower pressing part 40. After the hot pressing, in a state where the upper pressing part 50 and the hot-pressing plate 21 are apart from the laminated body 90, the pushing pin 120 is moved upward in the stacking direction so as to push the buffer member 80 held by the holding section 62 of the frame part 60.

That is, after the hot pressing, the buffer member 80 held by the holding section 62 of the frame part 60 is pushed upward by the pushing pin 120. Thus, a printed circuit board 92 adhering to the buffer member 80 due to the hot pressing can be easily separated from the buffer member 80.

Before the hot pressing, the buffer member 80 is held by only the holding section 62 of the frame part 60 and the escape space 101 is provided between the lower pressing part 40 and the buffer member 80. After the hot pressing is finished and the pressure is released, the shape of the buffer member 80 recovers. Thus, also after the hot pressing, the escape space 101 is provided between the lower pressing part 40 and the buffer member 80. When the buffer member 80 is pushed by the pushing pin 120, the buffer member 80 is in contact with only the frame part 60 of the pressing die 30. Because the buffer member 80 is in contact with the pressing die 30 at a small area, the buffer member 80 is easily deformed when the buffer member 80 is pushed by the pushing pin 120. Thus, the printed circuit board 92 can be easily separated from the buffer member 80.

In the above-described example, the pushing pin 120 is integrally provided with the lower pressing part 40 and functions as a part of the lower pressing part 40 during the hot pressing. Alternatively, the pushing element may be independent from the lower pressing part 40 in a case where the frame part 60 is held independently from the lower pressing part 40. In such a case, the pushing element may push the buffer member 80 upward in a state where the laminated body 90 is apart from the lower pressing part 40 and the upper pressing part 50.

Third Embodiment

Figure 6:
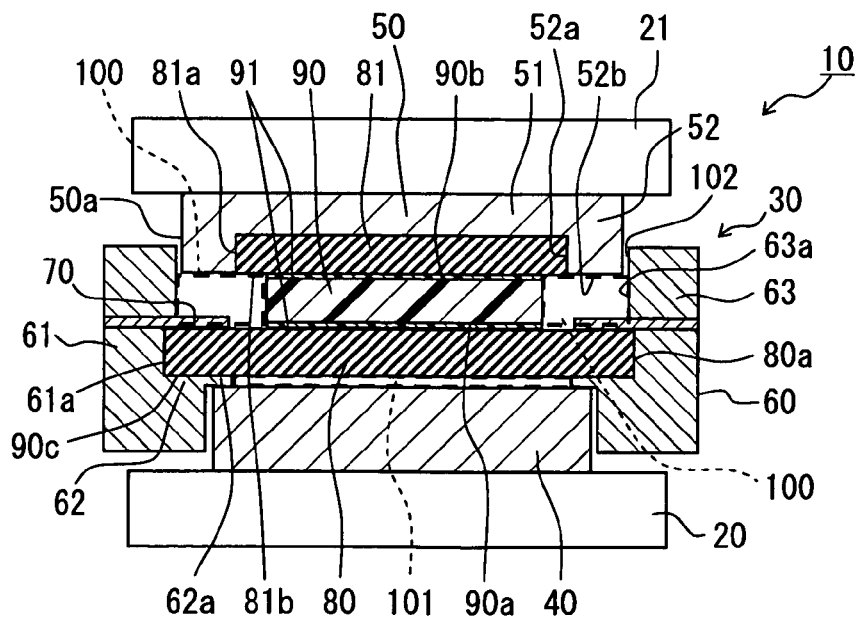
FIG. 6 is a diagram illustrating a cross-sectional view of a printed circuit board manufacturing equipment according to a third embodiment of the present invention before a hot pressing.
Figure 7:
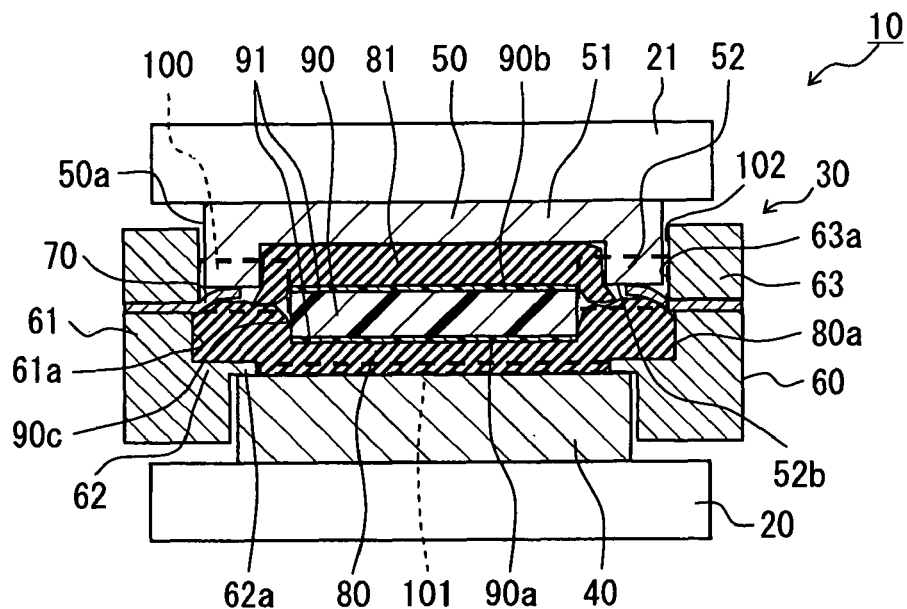
FIG. 7 is a diagram illustrating a cross-sectional view of the printed circuit board manufacturing equipment according to the third embodiment during the hot pressing.

A printed circuit board manufacturing apparatus 10 according to a third embodiment will be described with reference to FIG. 6 and FIG. 7.

In the above-described embodiments, the buffer member 80 is disposed only between the lower pressing part 40 and the laminated body 90. That is, the buffer member 80 is disposed on only one side of the laminated body 90 in the stacking direction.

In the printed circuit board manufacturing equipment 10 according to the present embodiment, the buffer member 80 is disposed between the lower pressing part 40 and the laminated body 90 and another buffer member 81 is disposed between the upper pressing part 50 and the laminated body 90.

The buffer member 81 is provided for reducing variation in the pressure applied from the pressing die 30 to each portion of the laminated body 90. The buffer member 81 has a low elastic modulus so as to be elastically deformable. For example, the buffer member 80 has a compressive elastic modulus less than or equal to 10 about MPa. The buffer member 81 has a heat resistance so that the buffer member 81 can withstand the heat, for example, about 300 degrees centigrade during the hot pressing. The buffer member 81 may be made of a material different from the buffer member 80. In the present embodiment, the buffer member 81 is made of silicon rubber same as the buffer member 80. For example, the silicon rubber has a compressive elastic modulus less than or equal to about 10 Mpa, a heat resistance greater than or equal to about 300 degrees centigrade, an elongation greater than or equal to about 100 percent.

A horizontal dimension of the buffer member 81 is larger than the upper surface 90b of the laminated body 90 so as to cover the whole area of the upper surface 90b and the horizontal dimension of the buffer member 81 is smaller than the horizontal dimension of the buffer member 80.

The upper pressing part 50 includes a base section 51 and a sidewall section 52. The base section 51 has a plate shape and transmits the pressure and the heat from the hot-pressing plate 21 to the laminated body 90. The sidewall section 52 protrudes from a peripheral end portion of the base section 51 toward the laminated body 90. The sidewall section 52 has a ring shape surrounding the whole area of a side surface 81a of the buffer member 81. The sidewall section 52 restricts deformation of the buffer member 81 in the horizontal direction. Before the hot pressing, an inner surface 52a of the sidewall section 52 is located outside of the side surface 90c in the horizontal direction so that the sidewall section 52 does not overlap the laminated body 90 in the horizontal direction. The side surface 81a of the buffer member 81 is in contact with the inner surface 52a of the sidewall section 52. An end surface 52b of the sidewall section 52 faces the buffer member 80. By restricting the deformation of the buffer member 81 in the horizontal direction, plastic deformation of the buffer member 81 can be restricted.

Before the hot pressing, a part of the inner surface 63a of the fixing section 63 faces the side surface 50a of the upper pressing part 50 so that the clearance 102 is provided between the side surface 50a and the inner surface 63a. In the present embodiment, an outer surface of the sidewall section 52 becomes the side surface 50a of the upper pressing part 50. The escape space 100 is provided between the side surface 90c of the laminated body 90, the buffer member 81, the sidewall section 52 of the upper pressing part 50, and the buffer member 80.

During the hot pressing, the lip 70 comes in contact with the end surface 52b of the sidewall section 52.

In the printed circuit board manufacturing equipment 10 according to the present embodiment, the buffer member 80 is disposed between the lower surface 90a of the laminated body 90 and the lower pressing part 40 and the buffer member 81 is disposed between the upper surface 90b of the laminated body 90 and the upper pressing part 50. Each of the buffer members 80 and 81 has a low elastic modulus so as to be elastically deformable and has a high heat resistance so as to withstand the heat during the hot pressing. For example, each of the buffer members 80 and 81 has a compressive elastic modulus less than or equal to about 10 MPa. At least before the hot pressing, the escape space 100 is provided between the side surface 90c of the laminated body 90, the lower surface 81b of the buffer member 81, the sidewall section 52 of the upper pressing part 50, and the upper surface 80b of the buffer member 80. The escape space 100 is used for escaping the buffer members 80 and 81 deformed due to the pressure. Thus, the variation in the pressure applied from the hot-pressing plates 20 and 21 to each portion of the laminated body 90 can be reduced due to the elastic deformation of the buffer members 80 and 81. Thereby, the quality stability of the printed circuit board can be improved.

The lip 70 is fixed to the frame part 60. During the hot pressing, the lip 70 is deformed following the deformation of the buffer member 80 due to the pressure and comes in contact with the end surface 52b of the sidewall section 52 of the upper pressing part 50, as illustrated in FIG. 7. Thereby, the lip 70 closes the clearance 102. The whole area of side surface 81a of the buffer member 81 is surrounded by the sidewall section 52. The buffer member 80 is smaller than the buffer member 80. Before the buffer member 81 flows from escape space 100 to the outside, the lip 70 deformed following the deformation of the buffer member 80 comes in contact with the end surface 52b of the sidewall section 52 of the upper pressing part 50. Thus, before the buffer members 80 and 81 flow from the escape space 100 to the outside through the clearance 102, the part of the escape space 100 located between the lip 70 and the laminated body 90 is closed. Thereby, the buffer members 80 and 81 are deformed within the part of the escape space 100 located between the lip 70 and the laminated body 90 and the deforming amount of the buffer members 80 and 81 can be reduced. As a result, in the printed circuit board manufacturing equipment 10, the number of reusing the buffer members 80 and 81 can be increased.

In the present embodiment, the lower pressing part 40 is set to be the first pressing part, the upper pressing part 50 is set to be second pressing part, the buffer member 80 is disposed between the lower pressing part 40 and the laminated body 90, and the buffer member 81 is disposed between the upper pressing part 50 and the laminated body 90, as an example. Alternatively, the lower pressing part 40 may be the second pressing part, the upper pressing part 50 may be the first pressing part, the buffer member 80 may be disposed between the upper pressing part 50 and the laminated body 90, and the buffer member 81 may be disposed between the lower pressing part 40 and the laminated body 90.

Other Embodiments

Although the present invention has been fully described in connection with the exemplary embodiments thereof with reference to the accompanying drawings, it is to be noted that various changes and modifications will become apparent to those skilled in the art.

Figure 8:
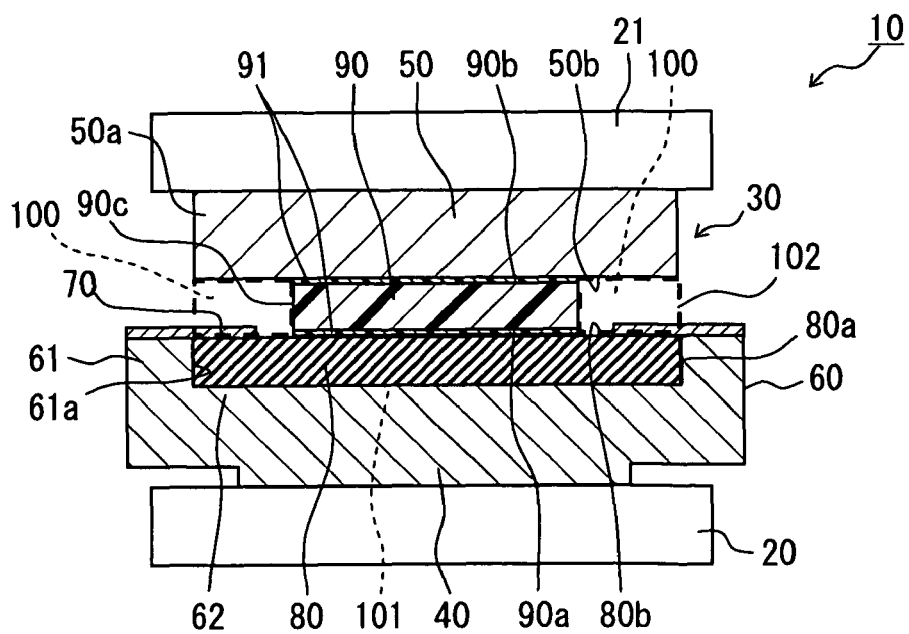
FIG. 8 is a diagram illustrating a cross-sectional view of a printed circuit board manufacturing equipment according to a modification.
Figure 9:
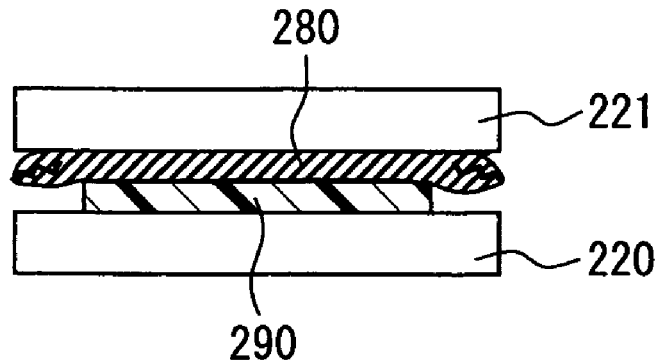
FIG. 9 is a diagram illustrating a cross-sectional view of a printed circuit board manufacturing equipment according to a first example of the related art.
Figure 10:
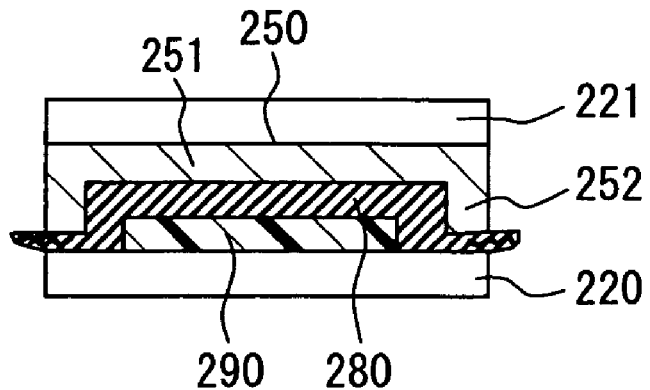
FIG. 10 is a diagram illustrating a cross-sectional view of a printed circuit board manufacturing equipment according to a second example of the related art.

In the above-described first to third embodiments, the lower pressing part 40, the upper pressing part 50, and the frame part 60 are independent from each other. Alternatively, the lower pressing part 40 and the frame part 60 may be integrally formed as illustrated in FIG. 8. Also in the present case, the pushing pin 120 may be provided so that the printed circuit board 92 can be easily separated from the buffer member 80.

In the above-described first to third embodiments, the escape spaces 100 and 101 are provided as a space for escaping the buffer member 80 deformed due to the pressure. However, at least the escape space 100 adjacent to the side surface 90c of the laminated body 90 is required. That is, as illustrated in FIG. 8, the printed circuit board manufacturing equipment 10 may have a configuration without the escape space 101. Based on the deforming amount of the buffer member 80, the printed circuit board manufacturing equipment 10 may have only the escape space 100 or the printed circuit board manufacturing equipment 10 may have both the escape spaces 100 and 101.

In the above-described first to third embodiments, the frame part 60 extends in the stacking direction to a position facing the side surface 50a of the upper pressing part 50. However, as illustrated in FIG. 8, the frame part 60 may not extend in the stacking direction to the position facing the side surface 50a of the upper pressing part 50. In the printed circuit board manufacturing equipment 10 illustrated in FIG. 8, the lip 70 is disposed on an upper surface of the base section 61 of the frame part 60 and is fixed to the frame part 60, for example, by binding or welding. The clearance 102 provided between the upper pressing part 50 and the frame part 60 becomes larger than the above-described first to third embodiments. In such a case, a horizontal force due to the flow of the buffer member 80 is received by only the lip 70. In a case where the frame part 60 extends to the position facing the side surface 50a of the upper pressing part 50, the horizontal force due to the flow of the buffer member 80 can be received by the frame part 60 and the lip 70.

In the above-described first to third embodiments, a protruding part of the lip 70 that protrudes from the frame part 60 toward the laminated body 90 has the ring shape. The protruding part may have any shape as long as the lip 70 can close the part of the escape space 100 located between the lip 70 and the laminated body 90, that is, the lip 70 can close the clearance 102 having a ring shape. When the protruding part of the lip 70 has a ring shape, a protruding length from the frame part 60 may vary in the circumferential direction.

In the above-described first to third embodiments, the lower pressing part 40 is independent from the hot-pressing plate 20 and the upper pressing part 50 is independent from the hot-pressing plate 21. Alternatively, the lower pressing part 40 may be integrated with the hot-pressing plate 20 and the upper pressing part 50 may be integrated with the hot-pressing plate 21. The laminated body 90 may be heated and pressed by the pressing die 30 directly or indirectly.

In the above-described first to third embodiments, the side surface 80a of the buffer member 80 is in contact with the inner surface 61a of the base section 61 before the hot pressing. Alternatively, a clearance may be provided between the side surface 80a of the buffer member 80 and the inner surface 61a of the base section 61 before the hot pressing. A dimension of the clearance is determined so that the buffer member 80 is not plastically deformed and the clearance is substantially filled with the buffer member 80 when the buffer member 80 is elastically deformed in the horizontal direction during the hot pressing. In a similar manner, a clearance may be provided between the side surface 81a of the buffer member 81 and the inner surface 52a of the sidewall section 52 before the hot pressing. In such a case, a dimension of the clearance is determined so that the clearance is substantially filled with the buffer member 81 when the buffer member 81 is elastically deformed in the horizontal direction during the hot pressing.

A configuration of the laminated body 90 is not limited to the above-described example. That is, the number of layers of the wiring patterns 112, the arrangement of the wiring patterns 112, and the arrangement of the interlayer connectors 113 may be changed. In addition, the number of base films 111 may be changed.

In the above-described first to third embodiments, the die-releasing films 91 are disposed on the lower surface 90a and the upper surface 90b of the laminated body 90. However, the laminated body 91 can be omitted.

In the above-described first to third embodiments, the lip 70 may be fixed to the frame part so as to be detachable. In such a case, the lip 70 can be exchanged independently from the frame part 60. Thus, a cost can be reduced.

What is claimed is:

1. A printed circuit board manufacturing equipment for manufacturing a printed circuit board from a laminated body, the printed circuit board including a base member and a multilayer wiring pattern disposed in the base member, the laminated body including a plurality of base films made of a thermoplastic resin and stacked in a stacking direction, the laminated body having a first surface and a second surface opposing each other in the stacking direction and a side surface connecting the first surface and the second surface, the printed circuit board manufacturing equipment comprising:
    a pressing die configured to press and heat the laminated body from above and below in the stacking direction so that the plurality of base films adheres to each other and configurates the base member;
    a buffer member disposed between the first surface of the laminated body and the pressing die, the buffer member being larger than the first surface of the laminated body so as to cover a whole area of the first surface of the laminated body, the buffer member being elastically deformable, the buffer member configured to withstand the heating by the pressing die, the buffer member configured to reduce a variation in a pressure applied from the pressing die to each portion of the laminated body; and
    a lip having a thin plate shape, wherein:
    the pressing die includes a first pressing part, a second pressing part, and a frame part;
    the first pressing part faces the first surface of the laminated body through the buffer member;
    the first pressing part is larger than the first surface of the laminated body so as to cover the whole area of the first surface of the laminated body;
    the second pressing part is larger than the second surface of the laminated body so as to cover a whole area of the second surface of the laminated body;
    the second pressing part has a portion facing the second surface of the laminated body and a portion facing the buffer member;
    the second pressing part is apart from the first pressing part at least before the pressing and heating;
    the frame part has a ring shape and surrounds a whole area of a side surface of the buffer member in a direction approximately perpendicular to the stacking direction;
    the frame part is integrated with the first pressing part and is separated from the second pressing part at least during the pressing and heating;
    the side surface of the laminated body, the second pressing part, and the buffer member define a escape space therebetween at least before the pressing and heating so that the buffer member deformed due to the pressing escapes into the escape space;
    the lip protrudes from the frame part toward the laminated body and is located on a surface of the buffer member facing the laminated body; and
    the lip is deformable following the deformation of the buffer member and comes in contact with the surface of the second pressing part facing the laminated body.

2. The printed circuit board manufacturing equipment according to claim 1, wherein the buffer member is made of silicon rubber.

3. The printed circuit board manufacturing equipment according to claim 2, wherein:
    the buffer member has a compressive elastic modulus less than or equal to about 10 Mpa;
    the buffer member has a heat resistance greater than or equal to about 300 degrees centigrade; and
    the buffer member has an elongation greater than or equal to about 100 percent.

4. The printed circuit board manufacturing equipment according to claim 1, wherein the lip is made of metal.

5. The printed circuit board manufacturing equipment according to claim 1, wherein the frame part extends to a position facing a side surface of the second pressing part in a direction approximately perpendicular to the stacking direction before the pressing and heating.

6. The printed circuit board manufacturing equipment according to claim 1, wherein the frame part and the first pressing part are integrally formed.

7. The printed circuit board manufacturing equipment according to claim 1, wherein:
- the frame part and the first pressing part are separately formed;
- the frame part is integrated with the first pressing part by being in contact with the first pressing part in a ring manner; and
- the frame part holds a peripheral end portion of a surface of the buffer member facing the first pressing part.

8. The printed circuit board manufacturing equipment according to claim 1, further comprising a pushing element configured to be movable from a first pressing part side toward a second pressing part side after the pressing and heating so as to push the buffer member from the first pressing part side.

9. The printed circuit board manufacturing equipment according to claim 1, further comprising another buffer member disposed between the second surface of the laminated body and the second pressing part, wherein:
- the second pressing part has a sidewall section having a ring shape;
- the sidewall section protrudes from a peripheral end portion of the surface of the second pressing part facing the laminated body toward the laminated body; and
- the sidewall section surrounds a whole area of a side surface of the another buffer member.

10. The printed circuit board manufacturing equipment according to claim 1, wherein the lip is fixed to the frame part so as to be detachable.

\* \* \* \* \*